United States Patent [19]
Garza et al.

[11] Patent Number: 5,723,233
[45] Date of Patent: Mar. 3, 1998

[54] OPTICAL PROXIMITY CORRECTION METHOD AND APPARATUS

[75] Inventors: Mario Garza, Sunnyvale; Nicholas K. Eib; Keith K. Chao, both of San Jose, all of Calif.

[73] Assignee: LSI Logic Corporation, Milpitas, Calif.

[21] Appl. No.: 607,365

[22] Filed: Feb. 27, 1996

[51] Int. Cl.$^6$ ........................................... G03F 9/00
[52] U.S. Cl. ........................................ 430/5; 430/22
[58] Field of Search ........................ 430/5, 22, 311; 382/144, 145, 147

[56] References Cited

U.S. PATENT DOCUMENTS 5,475,766  12/1995  Tsuchiya et al. .................. 382/144

Primary Examiner—S. Rosasco
Attorney, Agent, or Firm—Hickman Beyer & Weaver

[57] ABSTRACT

A photolithography optical proximity correction method for mask layouts (e.g., reticle masks) is disclosed. The method includes performing pattern recognition on a layout design to identify locations of feature edges with respect to other feature edges in the layout design. The method further includes obtaining an optical proximity correction for at least one of the feature edges by evaluating one or more non-linear mathematical expressions for optical proximity correction at the location of that edge with respect to other feature edges.

17 Claims, 8 Drawing Sheets

OPTICAL PROXIMITY CORRECTION METHOD AND APPARATUS

BACKGROUND OF THE INVENTION

The present invention relates to photolithography techniques. More particularly, the invention relates to improved methods and apparatuses for performing optical proximity correction.

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of photolithographic apparatus is a "reticle" which includes a pattern corresponding to features at one layer in an IC design. Such reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

The resist (sometimes referred to as a "photoresist") is provided as a thin layer of radiation-sensitive material that is spin-coated over the entire silicon wafer surface. The resist material is classified as either positive or negative depending on how it responds to light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor. For further information on IC fabrication and resist development methods, reference may be made to a book entitled *Integrated Circuit Fabrication Technology* by David J. Elliott, McGraw Hill, 1989.

FIG. 1A shows a hypothetical reticle 100 corresponding to an IC layout pattern. For simplicity, the IC pattern consists of three rectangular design features. A clear reticle glass 110 allows radiation to project onto a resist covered silicon wafer. Three rectangular chromium regions 102, 104 and 106 on reticle glass 110 block radiation to generate an image corresponding to intended IC design features.

As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they can not be ignored in layouts having features smaller than about 1 micron. The problems become especially pronounced in IC designs having feature sizes near the wavelength of light used in the photolithographic process.

FIG. 1B illustrates how diffraction and scattering affect an illumination pattern produced by radiation passing through reticle 100 and onto a section of silicon substrate 120. As shown, the illumination pattern contains an illuminated region 128 and three dark regions 122, 124, and 126 corresponding to chromium regions 102, 104, and 106 on reticle 100. The illuminated pattern exhibits considerable distortion, with dark regions 122, 124, and 126 having their corners rounded and their feature widths reduced. Other distortions commonly encountered in photolithography (and not illustrated here) include fusion of dense features and shifting of line segment positions. Unfortunately, any distorted illumination pattern propagates to a developed resist pattern and ultimately to IC features such as polysilicon gate regions, vias in dielectrics, etc. As a result, the IC performance is degraded or the IC becomes unusable.

To remedy this problem, a reticle correction technique known as optical proximity correction ("OPC") has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass.

FIG. 1C illustrates how optical proximity correction may be employed to modify the reticle design shown in FIG. 1A and thereby better provide the desired illumination pattern. As shown, a corrected reticle 140 includes three base rectangular features 142, 144, and 146 outlined in chromium on a glass plate 150. Various "corrections" have been added to these, base features. Some correction takes the form of "serifs" 148a–148f and 149a–149f. Serifs are small appendage-type addition or subtraction regions typically made at corner regions on reticle designs. In the example shown in FIG. 1C, the serifs are square chromium extensions protruding beyond the corners of base rectangles 142, 144, and 146. These features have the intended effect of "sharpening" the corners of the illumination pattern on the wafer surface. In addition to serifs, the reticle 140 includes segments 151a–151d to compensate for feature thinning known to result from optical distortion.

FIG. 1D shows an illumination pattern 160 produced on a wafer surface 160 by radiation passing through the reticle 140. As shown, the illuminated region includes a light region 168 surrounding a set of dark regions 162, 164 and 166 which rather faithfully represent the intended pattern shown in FIG. 1A. Note that the illumination pattern shown in FIG. 1B of an uncorrected reticle has been greatly improved by use of an optical proximity corrected reticle.

Obviously, the degree of optical proximity correction (i.e., the size and location of correction segments) for any IC feature depends upon the desired IC feature size and the location of such feature with respect to other IC features. For example, the width of any one of segments 151a–151d may have to be increased or decreased if the width of any of the base rectangles 142, 144, and 146 is increased or decreased or if the spacing between any of these base rectangles is increased or decreased.

Today, the degree of correction necessary for a given feature is determined largely by empirical methods. That is, experiments are conducted with reticles having "test" patterns to determine the illumination pattern produced on a wafer by light shown through the test pattern. The deviation between the actual illumination pattern and the desired feature pattern is used to determine how much optical proximity correction is required for a reticle used to produce the desired feature pattern. For example, the reticle 100 of FIG. 1A may be used as a test reticle. A single experiment would show that the illumination pattern produced by reticle 100 corresponds to that shown in FIG. 1B. The rounding and thinning effects observed would lead an OPC designer to specify that when the pattern of FIG. 1A is desired, the corrections shown in FIG. 1C should be employed. Specifically, the designer would specify the width and location of segments 151a–151d and serifs 148a–148f and 149a–149f.

Of course, these particular corrections apply only to patterns having the exact size and geometry shown in FIG. 1A. If the width of or separation between the base rectangles changes (in a different IC design for example), the widths and locations of segments 151a–151d would also have to change. Thus, additional experiments with test reticles having patterns of differing feature widths and separations would be necessary to accurately determine the degree of optical proximity correction required for a changed pattern. Given the huge range of IC feature variations on even a single chip, a potentially infinite number of test reticles would have to be produced to account for every pattern that might be encountered. Luckily, for most patterns, it has been found that the degree of optical proximity correction can be estimated with good accuracy by interpolating linearly between the actual amount of correction found to be necessary for two test patterns "straddling" (in terms of sizing and/or spacing) a real feature on an IC design. Further, the degree of correction for very small patterns lying beyond a range of experimental patterns may often be predicted with good accuracy by linear extrapolation. Because these techniques require that only a relatively few test reticles be generated, many OPC systems in use today employ such linear interpolation and extrapolation techniques.

Unfortunately, it has been found that as feature sizes decrease beyond a certain critical dimension (in some cases about 0.5 microns for ultra-violet radiation), the above-described linear interpolation/extrapolation techniques no longer work well. This is because the amount of correction required for a given pattern no longer varies in a linear fashion.

The non-linear effect is depicted in FIGS. 2A and 2B. FIG. 2A shows a reticle 200 having critical dimensions below a linear threshold (e.g., below about 0.5 microns). When a linear optical proximity correction is performed to correct for optical distortions expected in the linear regime, the resulting illumination pattern is unacceptably distorted. Specifically, it has been observed that although serifs 228a–228f and 229a–229f and segments 251a–251d can be added to the reticle design in a manner predicted by conventional linear interpolation/extrapolation, inappropriate fusing and thinning of bars 262, 264, and 266 appear in the illumination pattern on a substrate 260 as shown in FIG. 2B.

To remedy this problem, one might suggest performing more tests in the non-linear regime and using the test results to develop a more detailed OPC protocol. However, the number of experiments required would consume too many resources to be cost effective. Thus, what is needed is an improved method and apparatus for correcting photolithography reticle design patterns having critical dimensions in the non-linear regime without requiring a great many additional experiments.

SUMMARY OF THE INVENTION

The present invention fills this need by providing an optical proximity correction method which employs a non-linear mathematical function for determining the amount of correction required for an arbitrary IC pattern having dimensions in the non-linear correction regime. The non-linear function should be developed to accurately depict the variation in required optical proximity correction with decreasing critical dimension in the non-linear regime described above. In one aspect, the present invention provides an optical proximity correction method which can be characterized as including the following steps: (a) performing pattern recognition on an integrated circuit layout design to identify a location of a selected feature edge in the layout design; (b) obtaining an optical proximity correction value for the selected feature edge by evaluating one or more non-linear mathematical expressions for optical proximity correction at the location of the selected feature edge; and (c) incorporating the optical proximity correction value into the layout design to form a reticle design.

Preferably, the above steps are repeated many times to scan multiple feature edges in the layout design. For each such feature edge, the method preferably determines whether that feature edge is associated with a feature having a critical dimension above a pre-selected value. If so, the method skips steps (b) and (c) above. In this manner, unnecessary computation is avoided as larger features reap relatively little benefit from OPC. Preferably, the pre-selected value is about 0.5 µm or greater: at least for conventional photolithography performed with ultra-violet radiation.

The non-linear mathematical expression(s) may be evaluated by directly solving the expression. However, for computation efficiency, it may be desirable to store the expression as a series of discreet optical proximity correction values generated from the non-linear mathematical expression. Then when a feature edge is to be evaluated, the degree of correction is picked off of a look-up table of discreet points rather than solving a complicated mathematical expression.

In preferred embodiments, the non-linear mathematical expressions are evaluated at coordinates provided as combinations of at least (i) one value representing the width of a light transmitting region adjacent to the selected feature edge, and (ii) a second value representing a width of a light blocking region adjacent to the selected feature edge. Thus, the degree of connection is a function of both the feature width and the interfeature spacing adjacent the feature. The resulting correction is sometimes confirmed against one or more predetermined rules. Such rules may specify the minimum spacing between adjacent light blocking regions for a particular design family.

In another aspect, the invention provides an apparatus for performing optical proximity correction on layout designs to be used in photolithography. The apparatus may be characterized as including the following components: (a) means for performing pattern recognition on an integrated circuit layout design to identify locations of selected feature edges in the layout design; and (b) means for obtaining an optical proximity correction value for at least one of the selected feature edges by evaluating one or more non-linear mathematical expressions for optical proximity correction at the location of the at least one selected feature edge. In further preferred embodiments, the apparatus includes means for determining whether the selected feature edges are associated with features having a critical dimension of at most about a predefined value. When such means for determining finds that a particular feature edge is associated with a feature having a critical dimension greater than the predefined value, an optical proximity correction value is not obtained. As noted above, this improves computational efficiency. It should be noted that the apparatus of this invention will preferably be implemented as software on a digital computer system. This is particularly convenient, as most IC designs are today provided in digital form. The software of this invention simply acts on the IC designs as described to generate a reticle design which can be printed on an actual reticle.

These and other features and advantages of the present invention will become apparent upon reading the following detailed descriptions and studying the various figures of the drawings.

DETAILED DESCRIPTION OF THE PREFERRED EMBODIMENTS

FIGS. 1A–D and 2A–B, as described above, illustrate that some conventional optical proximity correction methods are unable to correct reticle design patterns having very small critical dimensions (e.g., below about 0.5 microns). The present invention utilizes non-linear mathematical expressions to ascertain the degree of correction required for any such patterns having critical dimensions in such non-linear domain. The necessary non-linear mathematical expressions may be generated by various means. In a preferred embodiment, they are generated by curve fitting data from experiments on incrementally sized reticle designs having critical dimensions in the non-linear region. They may also be generated from computer simulated data of patterns having critical dimensions in the non-linear region.

A. PREPARING EXPRESSIONS FOR NON-LINEAR OPTICAL PROXIMITY CORRECTION

Figure 3:
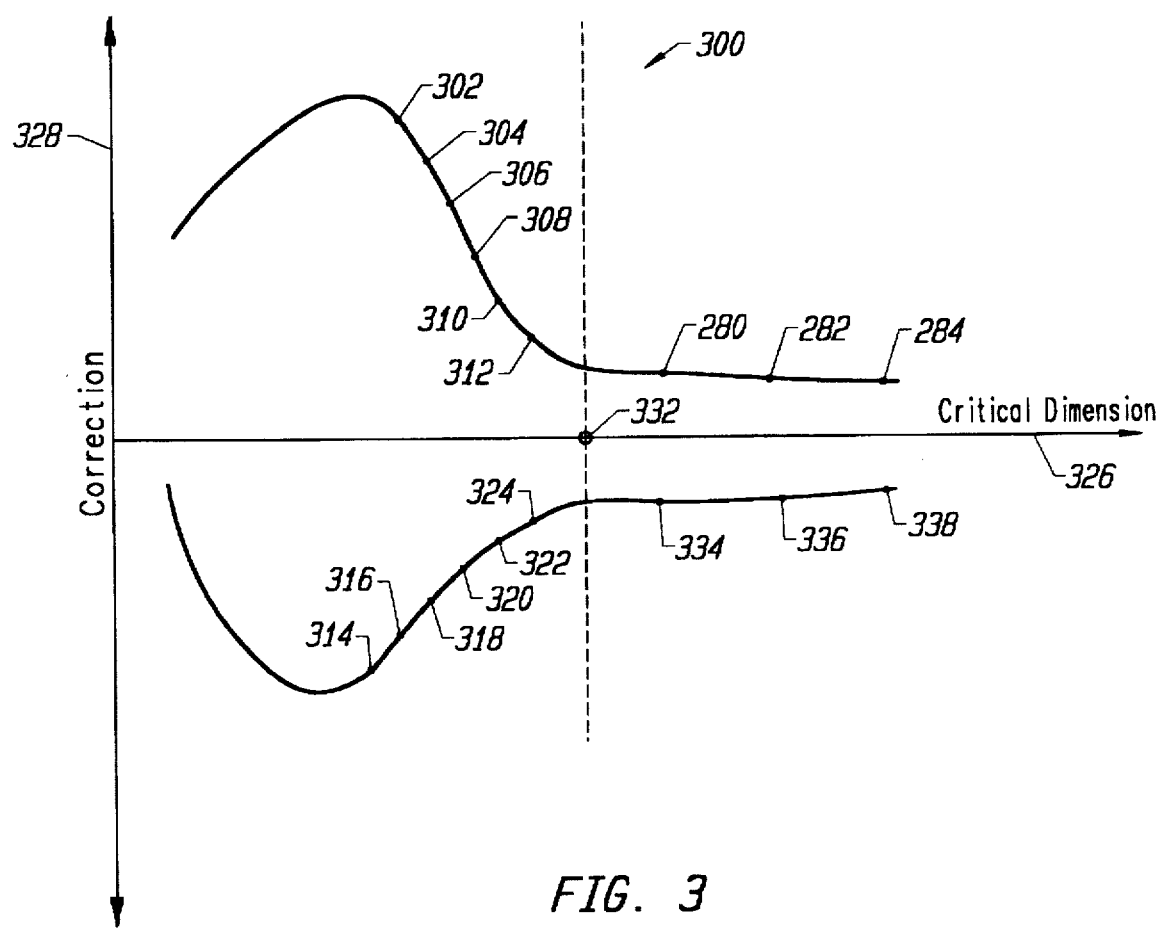
FIG. 3 shows, in accordance with one aspect of the present invention, a plurality of experimentally determined OPC values plotted as functions feature size and spacing size (critical dimensions) for patterns in the linear and non-linear regimes.

The method for preparing non-linear expressions for OPC in accordance with the present invention will now be described with reference to FIGS. 3 through 5. Referring first to FIG. 3, there is shown a graph 300 including mock experimental optical proximity correction values plotted versus (1) a critical dimensions based upon feature size (plotted above the horizontal axis), and (2) critical dimensions based upon spacing between features (plotted below the horizontal axis). By way of example, a critical dimension based upon feature size might be the width of dark region 122 shown in FIG. 1B, while a critical dimension based upon spacing might be the distance between dark regions 122 and 124 in FIG. 1B. In general, the features described herein correspond to IC features such as transistor gate electrodes, metallization conductive lines and the like.

Returning to FIG. 3, representative data points taken from hypothetical test reticles are plotted on a grid having a vertical axis 328 representing optical proximity correction values and a horizontal axis 326 representing the critical dimension (in feature size and spacing between features). As can be seen for values of critical dimension above a point 332, optical proximity correction values vary in a generally linear manner. However, below point 332, the optical proximity correction values vary non-linearly. Specifically, points 302, 304, 306, 308, 310, and 312 specify the degree of correction for feature widths in the non-linear regime, while points 280, 282, and 284 specify the degree of correction for feature widths in the linear regime. Similarly, points 314, 316, 318, 320, 322, and 324 specify the degree of correction required for interfeature spacing in the non-linear regime, while points 334, 336, and 338 specify the degree of correction required for interfeature spacing in the linear regime.

For ultra-violet radiation at about 365 nm, the transition between linear and non-linear domains (point 332) sometimes corresponds to a critical dimension of approximately 0.5 microns for both feature width and interfeature spacing. Of course, the transition between the linear and non-linear regions may occur more gradually than depicted in FIG. 3.

Figure 4:
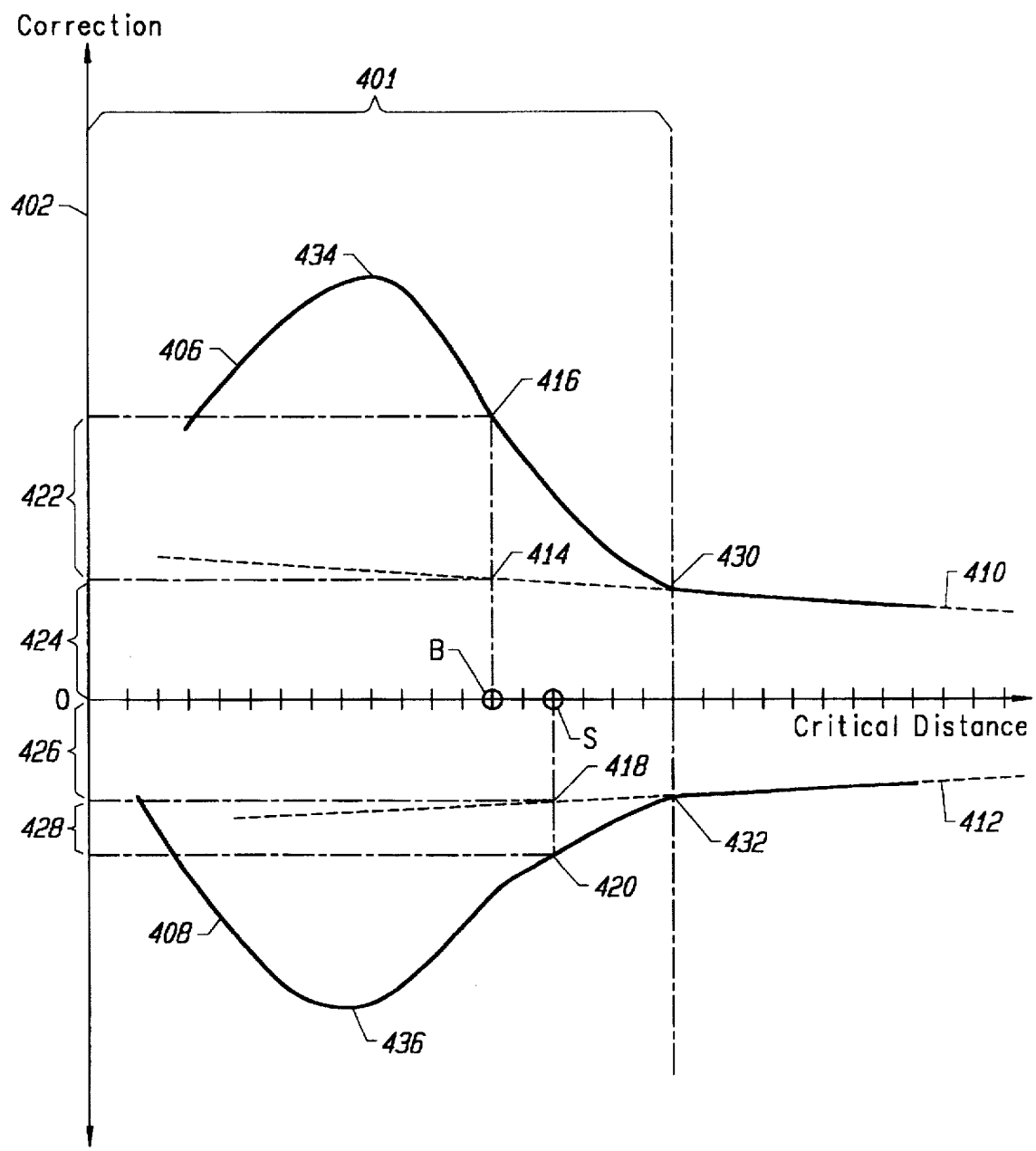
FIG. 4 illustrates, in one embodiment, a mathematical expression designed to express OPC values as functions of feature size and spacing size (critical dimensions) for patterns in the linear and non-linear regimes.

FIG. 4 presents a graphical representation 400 of two non-linear mathematical expressions 406 and 408 which provide optical proximity correction values as a continuous function of feature width (in the case of expression 406) and interfeature spacing (in the case of expression 408). As before, a vertical axis 402 specifies the value of optical proximity correction, while a horizontal axis specifies critical dimension. In a preferred embodiment, expression 406 is generated by curve fitting feature width test data and curve 408 is generated by curve fitting interfeature spacing test data (such as the data illustrated in FIG. 3). The resulting mathematical expressions have an identifiable non-linear region 401 which extends below point 430 for expression 406, and below point 432 for expression 408. Above points 430 and 432, the expressions 406 and 408 vary in a substantially linear fashion.

Preferably, the non-linear expressions generated in accordance with this invention are devised to apply a relatively wide range expected photolithography conditions. In this manner, a single expression (or group of expressions) can be used in photolithography systems where conditions such as depth of focus vary significantly over the surface of a single wafer. Further, such expression(s) could be used with various photolithography systems which may employ different light intensities for example. To generate in non-linear expressions in accordance with this goal, it may be necessary to conduct multiple experiments with a single reticle under the various conditions described above. Then an appropriate non-linear mathematical expression could be tailored to be accurate over rather wide conditions. In some cases, it may be desirable to include in the expression a term or factor that can be adjusted or calibrated for a variations in a specific condition such as depth of focus.

Returning to FIG. 4, the figure illustrates the difficulty associated with applying a conventional linear interpolation/ extrapolation technique to reticle designs for features having critical dimensions in the non-linear domain. For example, if a hypothetical feature edge has an associated width "B," then the correct optical proximity correction value for that feature edge would be identified with a point 416 on non-linear curve 406. Unfortunately if instead of the non-linear correction employed with the present invention, a conventional linear extrapolation technique was employed, a correction value associated with a point 414 would be obtained. As can be seen, point 414 is located on a line 410 extrapolated from known correction values associated with larger critical dimensions in the linear regime, and the linear correction value associated with point 414 is separated from the non-linear correction value associated with point 416 by an increment 422.

Similar results occur for interfeature spacing corrections based on non-linear curve 408. For example, if a hypothetical spacing having a critical dimension "S" is selected, the degree of optical proximity correction would be associated with a point 420, as shown on curve 408. As above, linear extrapolation techniques would provide an insufficient degree of correction. Specifically, the degree of correction associated with linear extrapolation would be a value at a point 418 on a linear extrapolation line 412. As can be seen, point 418 is associated with the linear correction factor 426 (presented on vertical axis 402), which is short of the actual correction value by an additional non-linear correction factor 428.

Thus, it has been recognized that the amount of optical proximity correction varies non-linearly for critical dimensions below a threshold region (e.g., about 0.5 microns). The present invention builds on this recognition by generating non-linear mathematical expressions which accurately represent optical proximity correction values for reticle designs having feature widths and/or feature spacings in the non-linear regime.

It should be noted that in many instances, it has been observed that curves 406 and 408 change direction at points 434 and 436, respectively. While the present invention can in theory be applied to features having critical dimensions smaller than points 434 and 436, such features are typically too small to be imaged with radiation at conventional wavelengths (e.g., the visible or ultra-violet regions of the electromagnetic spectrum). As a result, shorter wavelength radiation (e.g., X-rays) must be used to image smaller feature patterns.

In general, the non-linear mathematical expressions of this invention may be analytic expressions (e.g., polynomials) or numerical expressions. An analytic expression of this invention may take on a form such as $V_{OPC}=f(x,y,z)$, where $V_{OPC}$ is the value of the optical proximity correction and $f(x,y,z)$ is an analytic or numerical expression of the variables x, y, and z. In a some embodiments, only a single variable is used in the expression. That variable might be the value of the feature width or the interfeature spacing at a location of interest. In some embodiments, two or even three variables may be employed in the same expression. These may be the feature width, the interfeature spacing, the angle of a feature, or any of a number of other parameters associated with the feature edge of interest.

In one embodiment, the non-linear mathematical expression is stored as a comprehensive lookup table constructed by evaluating the expression at numerous critical dimension values. Using such lookup tables generally simplifies software operations and speeds up computation.

Figure 5:
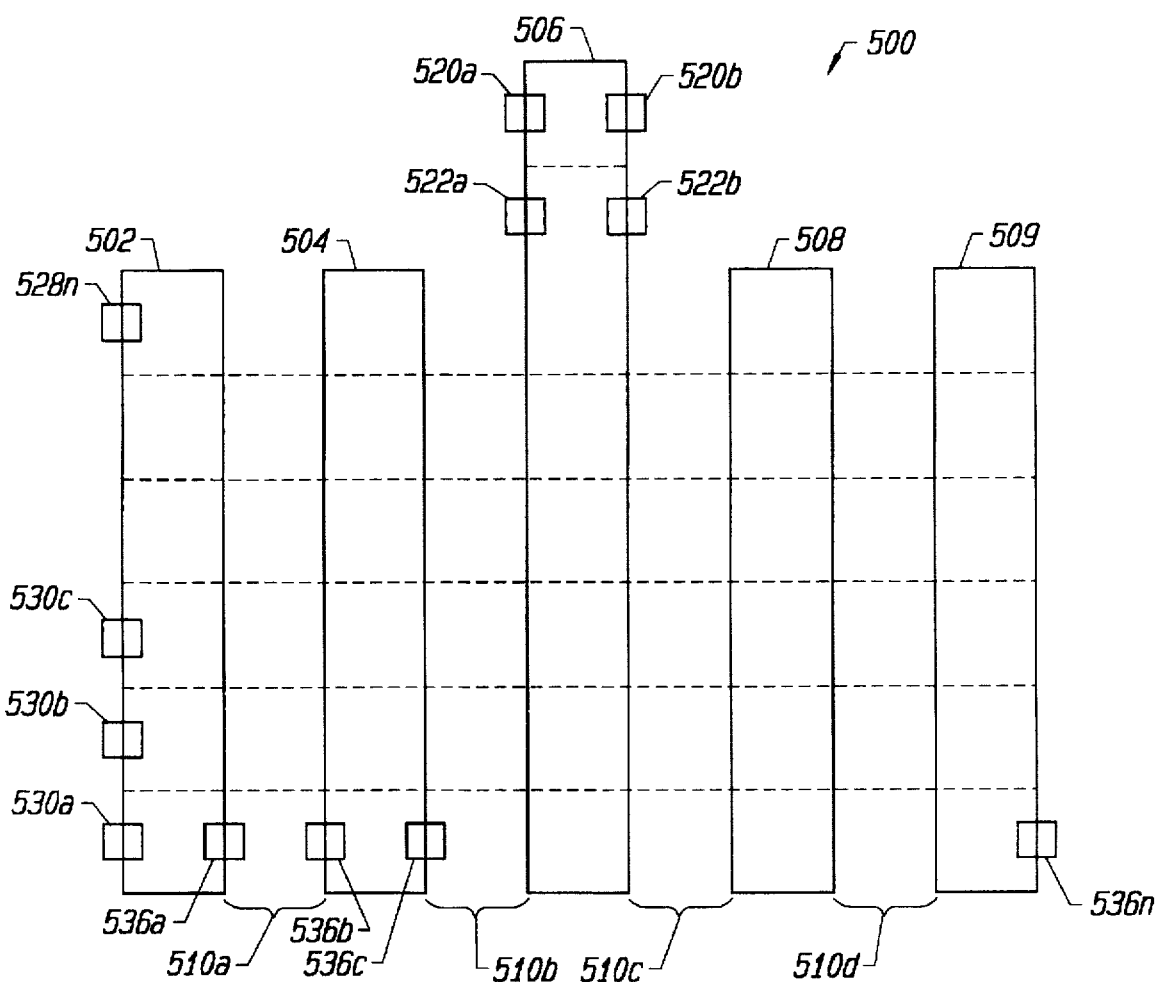
FIG. 5 illustrates, an exemplary reticle test pattern used to generate empirical OPC corrections necessary to derive the mathematical function presented in FIG. 4.

FIG. 5 shows a simple standardized reticle test pattern 500 known as a "paddle structure" which may be used to generate data for use in preparing a non-linear expression in accordance with this invention. In practice, a resist coated wafer is exposed to light passing through reticle 500. The resist is subsequently developed and the resulting pattern is evaluated with scanning electron microscopy to determine the degree of necessary correction.

The paddle structure has been found to efficiently provide various types of data. Specifically, the structure includes both a dense collection of features in its lower portion (bars 502, 504, 506, 508, and 509) and an isolated feature in its upper portion (bar 506). In general, the amount of correction required is a function of the local feature density, with isolated features requiring a certain amount and type of correction and dense features sometimes requiring a different amount and type of correction. Thus, by performing a single experiment on a reticle with a paddle pattern of a given size and shape, at least two valuable pieces of information can be obtained.

B. METHOD OF PERFORMING OPTICAL PROXIMITY CORRECTION IN THE NON-LINEAR DOMAIN

Figure 6:
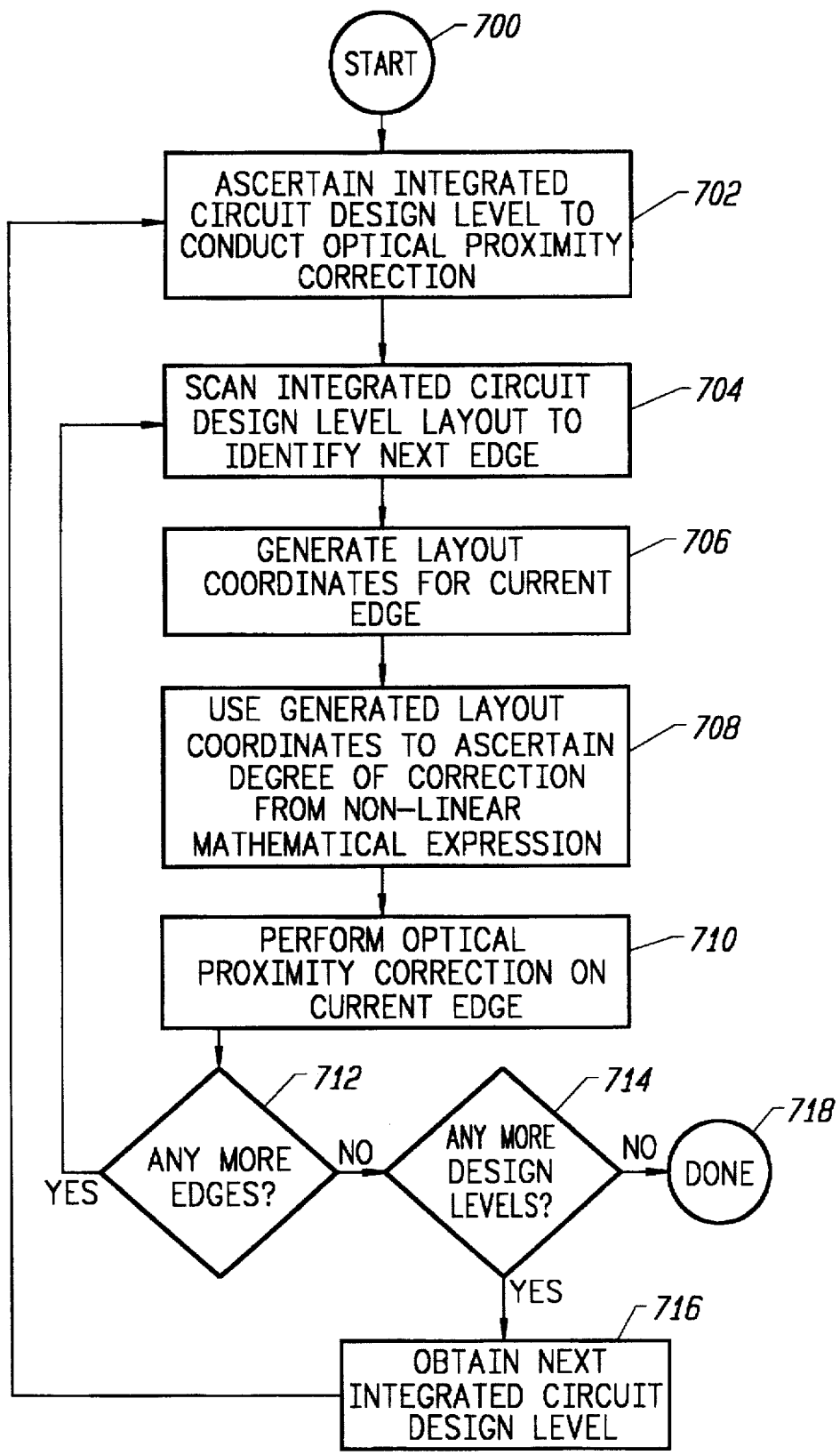
FIG. 6 is a process flow diagram illustrating the steps involved in developing a corrected reticle design in accordance with one embodiment of this invention.

FIG. 6 illustrates a process of the present invention for performing optical proximity correction in the non-linear regime. The process begins at 700 and in a step 702 determines which integrated circuit design level will be subjected to optical proximity correction. It should be understood that integrated circuits are formed with many different mask levels, each of which requires its own reticle. For example, one level may define the pattern for a p-type well implant, another level may define a transistor gate electrode pattern, yet another level may define a first metallization interconnection pattern, etc. For purposes of the process at hand, a design layout for a single level is selected for correction at step 702.

Next, the initial layout design for the selected layout level is obtained and a scan of its features is started at a step 704. The scanning process begins at an arbitrarily selected position of the layout design and proceeds in a defined direction until a feature edge is located. Such edge represents the boundary of a protected and unprotected region on a mask. After the current edge is identified at step 704, the method proceeds to a step 706 where coordinates associated with the current edge are generated. In a preferred embodiment, these coordinates include (1) the width of the feature (e.g., the protected region) at the current edge, and (2) the width of the space (e.g., the unprotected region) between the current edge and the edge of the next adjacent feature. The second coordinate has been referred to above as the "interfeature spacing." Other possible coordinates associated with the current edge include the edge position of the next successive bar and/or space (beyond the bar and space associated with the current edge itself), the angle of the current edge, etc. In some embodiments, the method includes an additional step of determining whether a feature size exceeds a critical dimension (e.g., one micron). If so, current edge is ignored and the next edge is located. This may substantially improve the computational efficiency of the method by eliminating unnecessary correction calculations.

After the current edge coordinates have been identified in step 706, the method proceeds to a step 708 where the coordinates are evaluated with a non-linear mathematical expression obtained as described above in connection with FIG. 4. As shown in FIG. 4, a particular value of optical proximity correction may be obtained for a feature width or an interfeature spacing or both. If both the feature width and the interfeature spacing are used to determine the correction, the non-linear correction expression should be written as a function of at least those two variables. In such cases, the two curves 406 and 408 shown in FIG. 4 would have to be merged in a single function that could be depicted in three-dimensional space.

After the degree of optical proximity correction has been determined for the current edge at step 708, a step 710 performs a correction on the current edge. For example, the feature width may be increased or reduced at that edge, a serif may be added at the edge (see FIG. 1C for example), etc. In addition, correction may also entail shifting entire features in an attempt to prevent features from fusing together. From step 710, the method proceeds to a step 712 where a decision is made as to whether anymore edges are present in the current IC design layout level. If there are more edges, then process control reverts to step 702 where the next edge is identified by scanning in the original direction until the next edge is located. At that point, the new edge becomes the current edge and process steps 706, 708, and 710 are performed at the new current edge. Then, it is determined at step 712 whether any more edges are present.

When all edges in the design layout have been processed and corrected as necessary, (i.e., there are no more edges present in the layout design of the current level), the method proceeds to a step 714 where it is determined whether there are any more design levels. If there are more design levels, the method proceeds to a step 716 where the next design level is obtained. For example, if a layout for a via level has just been completely corrected, step 716 may obtain the design layout for a first metallization layer to be formed immediately on top of the via level. From step 716, the method proceeds to step 702, and from there through steps 704, 706, 708, 710, 712, and if no more edges are present for that level, then the method proceeds to step 714. When all design layout levels to be corrected have been corrected (i.e., decision step 714 is answered in the negative), then the optical proximity correction method is completed at 718.

It should be recognized that the above method is typically implemented as software on a digital computer system. The IC layout designs are provided as digitized patterns defining a desired mask layout on a chip. These digitized patterns are scanned with pattern recognition software which can identify edges and associated feature/spacing sizes. The pattern recognition software may even identify and choose to ignore features that are greater than a predefined size, e.g., one micron. Ultimately, the completely corrected reticle design is formed on an actual reticle such as a glass and chrome reticle.

The non-linear optical proximity correction function may be provided in the form of a programmed equation that can be directly evaluated for each set of coordinates that it receives. More preferably, however, the non-linear function is initially evaluated at numerous dimensions and stored in the form of a look-up table containing a series of discreet points corresponding to correction values for the corresponding feature dimensions. When a new coordinate is provided by the pattern recognition software, the nearest point from the look-up table is identified and used to provide the necessary correction value. Storing the non-linear mathematical function in the form of a look-up table significantly improves computational efficiency.

To further illustrate how the above described method may be implemented, reference is again made to FIG. 5. Specifically, the paddle pattern of FIG. 5 will now be assumed to be an IC design pattern that is to be subjected to non-linear optical proximity correction. As explained above, paddle structure 500 has four identically sized features (bars) 502, 504, 508 and 509 straddling a longer feature 506 having an isolated section at the top of the paddle pattern. In this technique, the optical proximity correction software scans the paddle in a raster-like manner in order to identify all feature edges. During the scanning process, various edges are identified on paddle structure 500.

In one embodiment, the scanning process begins in the lower left corner of the pattern and proceeds horizontally across the pattern. The first feature edge encountered will be 530a. In the context of the FIG. 6 flow diagram, edge 530a becomes the current edge (step 704). Thereafter, appropriate coordinates are obtained, the degree of correction is ascertained, and the correction is made as described with respect to steps 706, 708, and 710. Next, the pattern is horizontally scanned until the next feature edge 536a is identified. This edge is then evaluated per steps 706, 708, and 710. Continuing in this vein, edges 536b, 536c, ... 536n are encountered, evaluated, and corrected as specified by the non-linear functions described above.

When the end of the right edge of the pattern is encountered, the scanning process increments to a vertically adjacent position and again begins horizontal scanning. For example, the process may next encounter edge 530b. After evaluating and correcting that edge, the next successive edges are located and corrected as described until the right edge of the pattern is again encountered. At that point, the edge 530c is located and corrected. The scanning and correcting process continues in this manner through edge 528n where the pattern changes. At the next vertical increment, only a single feature will be found. Thus, after the top of bars 502, 504, 508, and 509 have been surpassed, the next edge encountered will be 522a. This edge is, of course, corrected as described above. The process thereafter continues through edges 522b, 520a, and 520b.

Often the scanning process will then be repeated in a vertical rasterized manner to pick off and correct horizontally aligned edges. In some IC layout designs, it may also be necessary to conduct raster scans in the diagonal directions at 45° (or some other angle) with respect to the vertical. The diagonal scans may be employed in designs having lines and other features oriented diagonally with respect to the main grid of the chip.

Each time an edge is encountered, relevant coordinates associated with that edge must be generated (step 706 of FIG. 6). For example, when feature edge 536a is encountered during the scan, the feature width (e.g., the width of bar 502) forms one coordinate, and the interfeature spacing 510a between bar 502 and next adjacent bar 504 forms a second coordinate. Similar coordinates for edge 536b include the width of bar 504 and the spacing 510a. For edge 536c, the coordinates include the width of bar 504 and spacing 510b. Spacings 510c and 510d would be used in the coordinates of other edges. Edges with no close adjacent features (e.g., edges 520a, 522b, 530a, and 536n) will have a coordinate selected to indicate this condition (e.g. infinity). In a preferred embodiment, any feature separated from an adjacent feature by one micron or more will meet this condition. Certain rules may apply to correcting features with such edges.

For simplicity and efficiency, the scanning process preferably is programmed to ignore critical dimensions greater than about one micron. This is done to increase correction speed for critical dimensions in the non-linear regime. As mentioned above, slight distortions impact sub-micron IC features more severely than IC features having critical dimensions larger than about one micron. In addition, the greater the number of corrections performed, the greater the number of possible errors produced. For example, "slivers" may be inadvertently introduced in an attempt to correct a particular feature geometry. Silvers are common in optical proximity correction, and they many consist of small serifs or segments that are intended to append to an IC feature, but are inadvertently left floating (i.e., unattached to a feature). Thus, limiting optical proximity correction to sub-micron features increases efficiency and avoids introducing additional opportunities for errors.

It should be noted that in addition to the basic calculation of optical proximity correction required for each feature edge, the method of the present invention may employ various design rules to supplement the correction values. Some of these rules may negate a correction provided by the non-linear expressions of this invention. Other rules may modify the correction value without negating the correction. Such rules are typically applied when a given feature and its local environment meet certain criteria. Such rules may, for example, specify a minimum interfeature spacing for a particular design family. More specifically, such minimum interfeature may be selected to be between about 0.2 and 0.5 microns (which might be varied within this range by 0.01 microns).

Figure 1A:
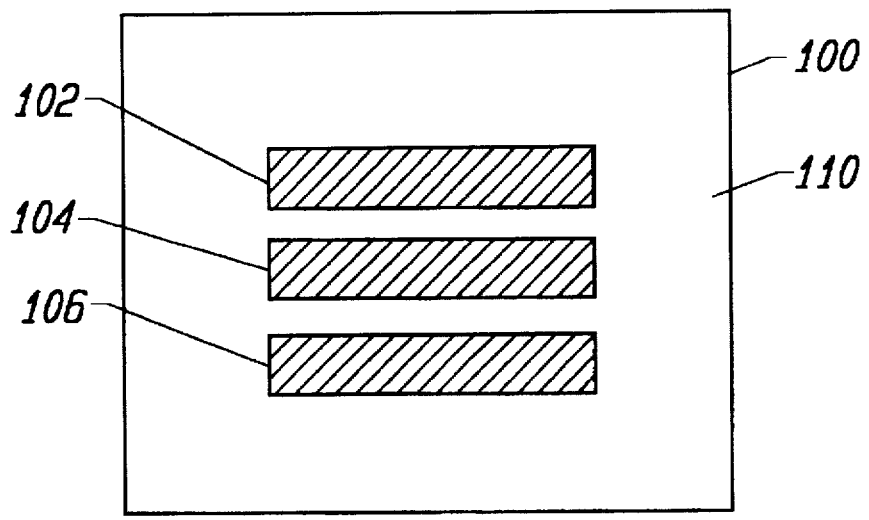
FIG. 1A illustrates a conventional reticle having an IC design pattern outlined in, for example, chromium on a glass backing.
Figure 1B:
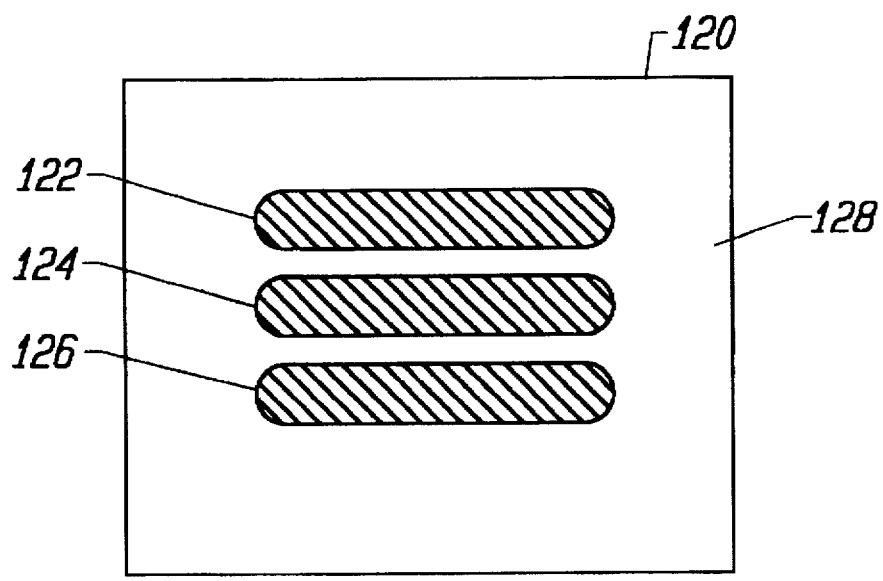
FIG. 1B shows an illumination pattern produced on a substrate by light shown through the reticle of FIG. 1A. The illumination pattern exhibits rounding and thinning effects that result when no optical proximity correction is performed.
Figure 1C:
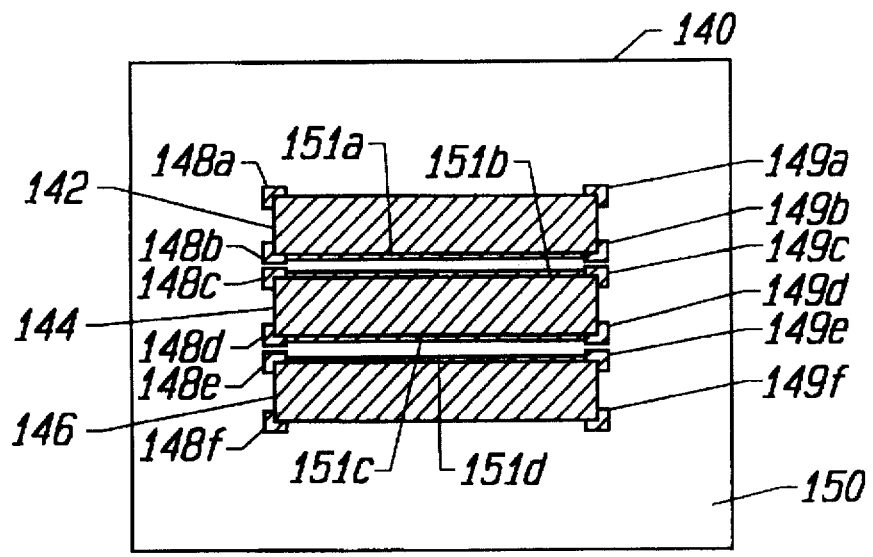
FIG. 1C illustrates a conventional reticle design employing optical proximity correction to overcome the rounding and thinning effects in the illumination pattern of FIG. 1B.
Figure 1D:
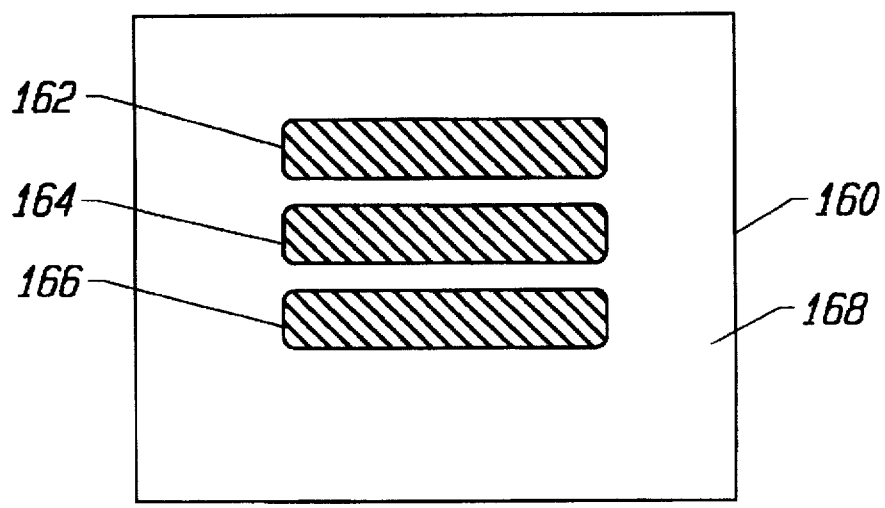
FIG. 1D shows an improved illumination pattern produced on a substrate by light shown through the optical proximity corrected reticle of FIG. 1C.
Figure 2A:
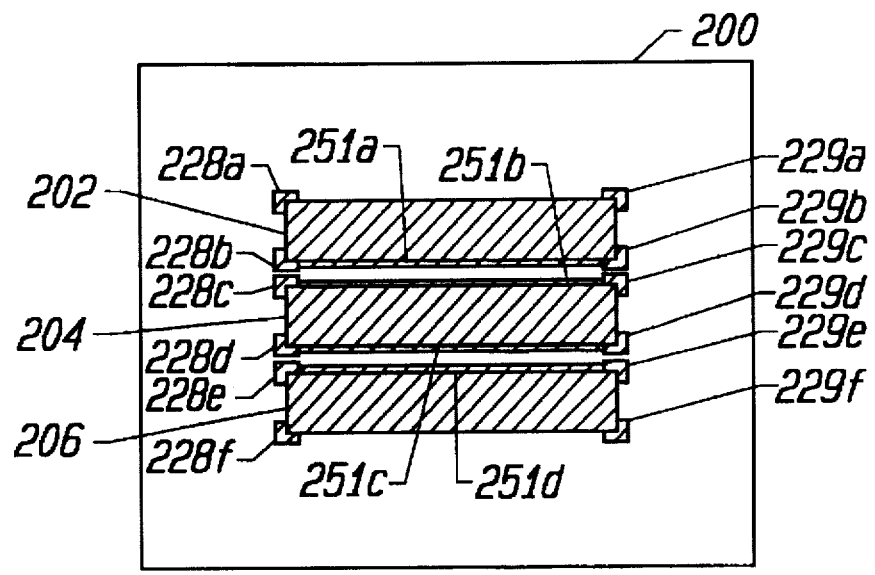
FIG. 2A illustrates a conventional optical proximity corrected reticle design for an IC design having critical dimensions in a non-linear correction regime.
Figure 2B:
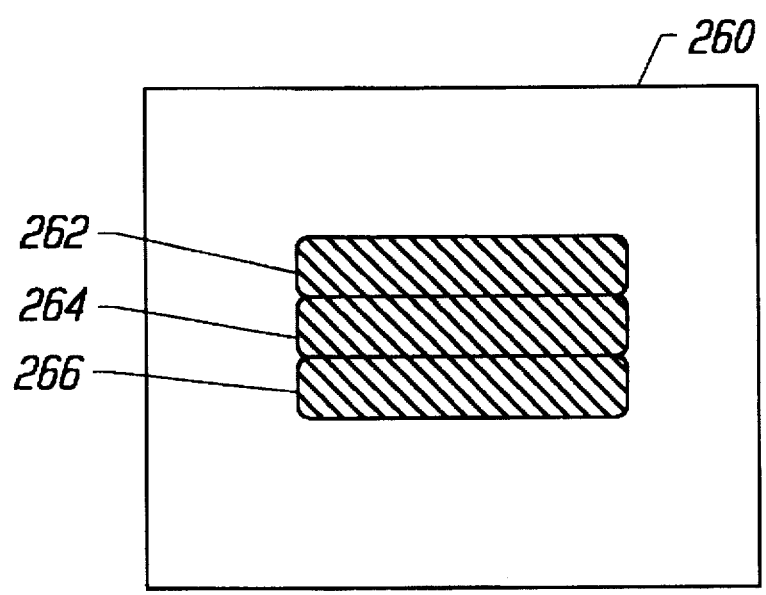
FIG. 2B shows a resulting fused illumination image produced on a substrate by light shown through the reticle of FIG. 2A.
Figure 7A:
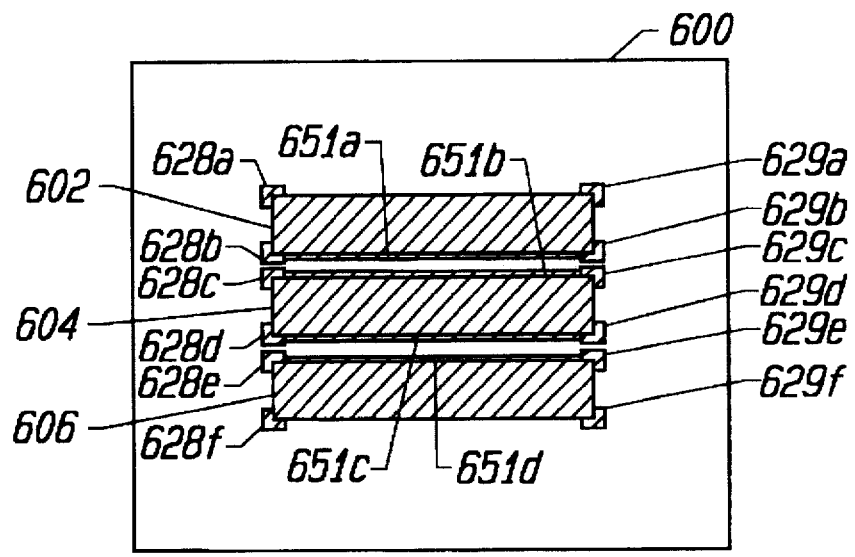
FIG. 7A illustrates a novel reticle design employing optical proximity correction obtained from a non-linear function to overcome the problematic effects noted in the illumination pattern of FIG. 2B.

FIG. 7A represents a reticle pattern having feature edges with critical dimensions in the non-linear regime (e.g., critical dimensions below about 0.5 microns). As illustrated in FIG. 2B, conventional optical proximity correction of an amount calculated for a linear case fails to prevent fusing in the developed resist regions. However, the non-linear optical proximity correction method of this invention is able to provide a correct degree of correction for very small features.

As shown in FIG. 7A, a reticle 600 includes three symmetric features 602, 604, and 606. In addition, after the appropriate corrections have been determined from the appropriate non-linear function, specific corrective segments and/or serifs were added. Specifically, the particular corrective serifs include regions 628a through 628f and 629a through 629f appended to each of the corners of features 602, 604 and 606. In addition, segments 651a through 651d were added to prevent feature thinning. Although no serifs or segments were shown subtracted from features 602, 604 and 606, more complex IC designs may require such corrective deletions.

Figure 7B:
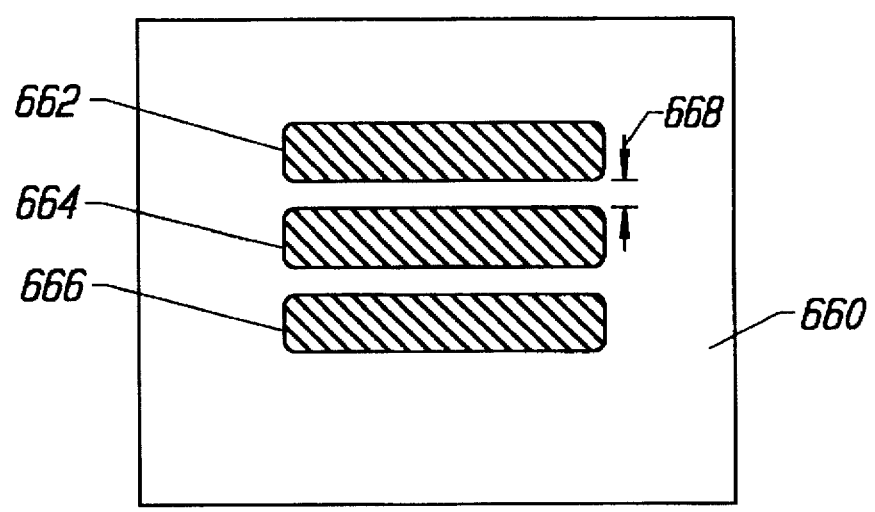
FIG. 7B shows an improved illumination pattern produced on a substrate by light shown through the optical proximity corrected reticle of FIG. 7A.

FIG. 7B shows an illumination pattern produced on a substrate 660 by light shining through reticle 600. As can be seen, illumination pattern 660 includes three dark regions 662, 664, and 666 separated from one another. For example, dark regions 662 and 664 are separated from one another by a light region 668. In contrast, the illumination pattern created by a linearly corrected reticle (e.g., see FIG. 2B) has fused dark regions. As mentioned above, the fused resist structure of FIG. 2B is a product of applying conventional optical proximity correction which fails to consider the non-linear behavior of correction associated with critical dimensions below a transition dimension (e.g., about 0.5 microns).

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. An optical proximity correction method for preparing reticle designs to be used in photolithography, the method comprising the following steps:

(a) performing pattern recognition on an integrated circuit layout design to identify a location of a selected feature edge in the layout design;

(b) obtaining an optical proximity correction value for said selected feature edge by evaluating one or more non-linear mathematical expressions for optical proximity correction at the location of the selected feature edge, the one or more non-linear mathematical expression defining a curve that non-linearly increases an amount of optical proximity correction for said selected feature edge; and (c) incorporating said optical proximity correction value into said layout design to form said reticle design.

2. The optical proximity correction method of claim 1, further comprising the following steps:

repeating steps (a) through (c) for multiple feature edges in said layout design;

for each feature edge located in step (a), determining whether the selected feature edge is associated with a feature having a critical dimension above a pre-selected value;

for any feature edge found to be associated with a feature having a critical dimension above said pre-selected value, skipping steps (b) and (c).

3. The optical proximity correction method of claim 2 wherein the pre-selected value is about 0.5 μm or greater.

4. The optical proximity correction method of claim 1, wherein said step of obtaining an optical proximity correction includes a step of evaluating said one of said non-linear mathematical expressions by directly solving said expression.

5. The optical proximity correction method of claim 1, wherein said step of obtaining an optical proximity correction includes a step of evaluating said one of said non-linear mathematical expressions by employing a look-up table of discreet optical proximity correction values generated from said non-linear mathematical expression.

6. The optical proximity correction method of claim 1, wherein the one or more non-linear mathematical expressions are evaluated at locations of the selected feature edges, which locations are provided as combinations of at least (i) one value representing the width of a light transmitting region adjacent to the selected feature edge, and (ii) a second value representing a width of a light blocking region adjacent to the selected feature edge.

7. The optical proximity correction method of claim 1, further comprising a step of confirming the optical proximity correction value obtained in step (b) against one or more predetermined rules.

8. An apparatus for performing optical proximity correction on layout designs to be used in photolithography, the apparatus comprising:

(a) means for performing pattern recognition on an integrated circuit layout design to identify locations of selected feature edges in the layout design; and (b) means for obtaining an optical proximity correction value for at least one of said selected feature edges by evaluating one or more non-linear mathematical expressions for optical proximity correction at the location of said at least one selected feature edge, the one or more non-linear mathematical expression defining a curve that non-linearly increases an amount of optical proximity correction for said at least one of said selected feature edges.

9. The apparatus for performing optical proximity correction of claim 8, further comprising means for determining whether the selected feature edges are associated with features having a critical dimension of at most about a predefined value, wherein when said means for determining finds that a particular feature edge is associated with a feature having a critical dimension greater than said predefined value, an optical proximity correction value is not obtained.

10. The apparatus for performing optical proximity correction of claim 8, wherein said means for obtaining an optical proximity correction value evaluates one of said non-linear mathematical expressions by directly solving said expression.

11. The apparatus for performing optical proximity correction of claim 8, wherein said means for obtaining an optical proximity correction evaluates said one of said non-linear mathematical expressions by employing a look up table of discreet optical proximity correction values generated from said non-linear mathematical expression.

12. The apparatus for performing optical proximity correction of claim 8, wherein the locations of the feature edges are provided as at least (i) one value representing a width of a light transmitting region adjacent to the selected feature edge, and (ii) a second value representing a width of a light blocking region adjacent to the selected feature edge.

13. The apparatus for performing optical proximity correction of claim 8, wherein the means for obtaining an optical proximity correction confirms the optical proximity correction value it obtains against one or more of predetermined rules.

14. A reticle design for use in photolithography, the reticle design having a pattern of light transmitting and light blocking regions specified at least in part by a non-linear proximity correction method comprising the following steps:

(a) performing pattern recognition on an integrated circuit layout design to identify a location of a selected feature edge in the layout design;

(b) obtaining an optical proximity correction value for said selected feature edge by evaluating one or more non-linear mathematical expressions for optical proximity correction at the location of the selected feature edge, the one or more non-linear mathematical expression defining a curve that non-linearly increases an amount of optical proximity correction for the selected feature edge; and (c) incorporating said optical proximity correction value into said layout design to form said reticle design.

15. The reticle design of claim 14, wherein the method of preparing the reticle design further comprises the following steps:

repeating steps (a) through (c) for multiple feature edges in said layout design;

for each feature edge located in step (a), determining whether the selected feature edge is associated with a feature having a critical dimension above a pre-selected value;

for any feature edge found to be associated with a feature having a critical dimension above said pre-selected value, skipping steps (b) and (c).

16. The reticle design of claim 14, wherein the one or more non-linear mathematical expressions are evaluated at locations of the selected feature edges, which locations are provided as combinations of at least (i) one value representing the width of a light transmitting region adjacent to the selected feature edge, and (ii) a second value representing a width of a light blocking region adjacent to the selected feature edge.

17. The reticle design of claim 14, wherein the method of preparing the reticle design further comprises a step of confirming the optical proximity correction value obtained in step (b) against one or more predetermined rules.

* * * * *